United States Patent [19]

Wellendorf

[11] 4,328,515

[45] May 4, 1982

[54] METHOD AND A DEVICE FOR RECORRECTING STANDARD COLOR CORRECTIONS IN A COLOR PICTURE RECORDING

[75] Inventor: Klaus Wellendorf, Heikendorf, Fed. Rep. of Germany

[73] Assignee: Dr. Ing. -Rudolf Hell GmbH, Kiel, Fed. Rep. of Germany

[21] Appl. No.: 91,899

[22] Filed: Nov. 7, 1979

[30] Foreign Application Priority Data

Nov. 8, 1978 [DE] Fed. Rep. of Germany ....... 2848376

[51] Int. Cl.³ .............................................. G03F 3/08
[52] U.S. Cl. .................................................... 358/80
[58] Field of Search ......................................... 358/80

[56] References Cited

U.S. PATENT DOCUMENTS

4,236,174  11/1980  Gall ..................................... 358/80

FOREIGN PATENT DOCUMENTS

1400806  7/1975  United Kingdom .................. 358/80

OTHER PUBLICATIONS

McGraw-Hill, *Dictionary of Scientific and Technical Terms*, 2nd edition, 1978, pp. 252, 401.

*Primary Examiner*—John C. Martin
*Attorney, Agent, or Firm*—Hill, Van Santen, Steadman, Chiara & Simpson

[57] ABSTRACT

A color correction technique is disclosed in which standardized color correction signals are stored in an addressable memory which emits a plurality of digitalized trichromatic picture scanning values as input values in a corresponding plurality of corrected picture recording signals as output values. An assignment of memory input to memory output is fed into the memory as standardized color correction data before reproduction. For a location to be specially corrected, the color signals thereof are measured and compared with predetermined values and a difference formation is provided between the memory output signals and the predetermined values, the difference values being stored and utilized, in connection with distance calculations of neighboring points, to input re-corrected color correction values into the addressable memory.

18 Claims, 13 Drawing Figures

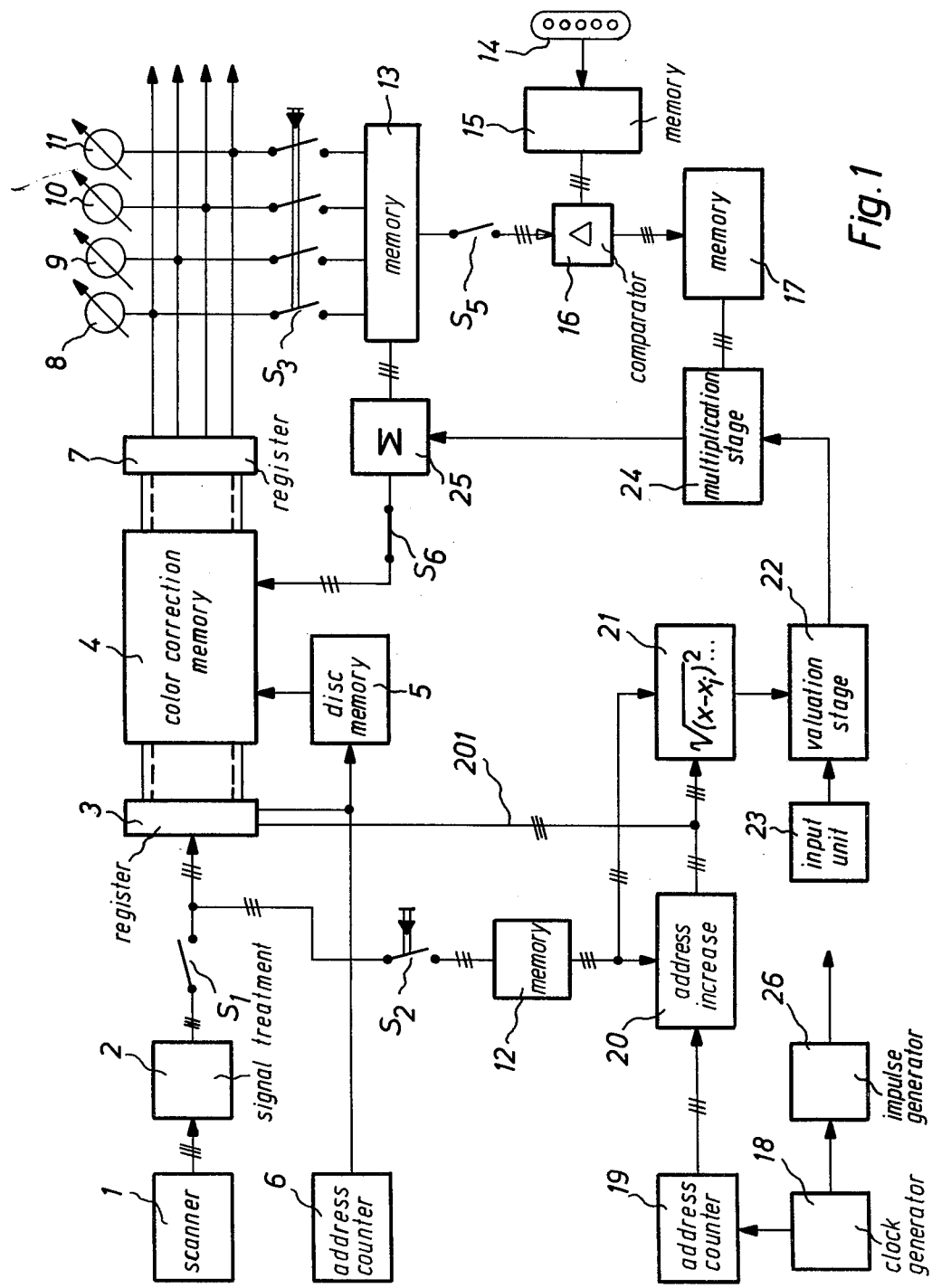

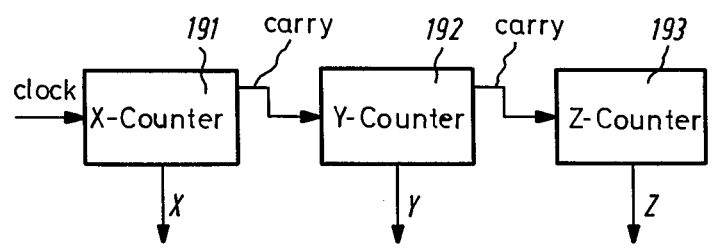
Fig. 1a
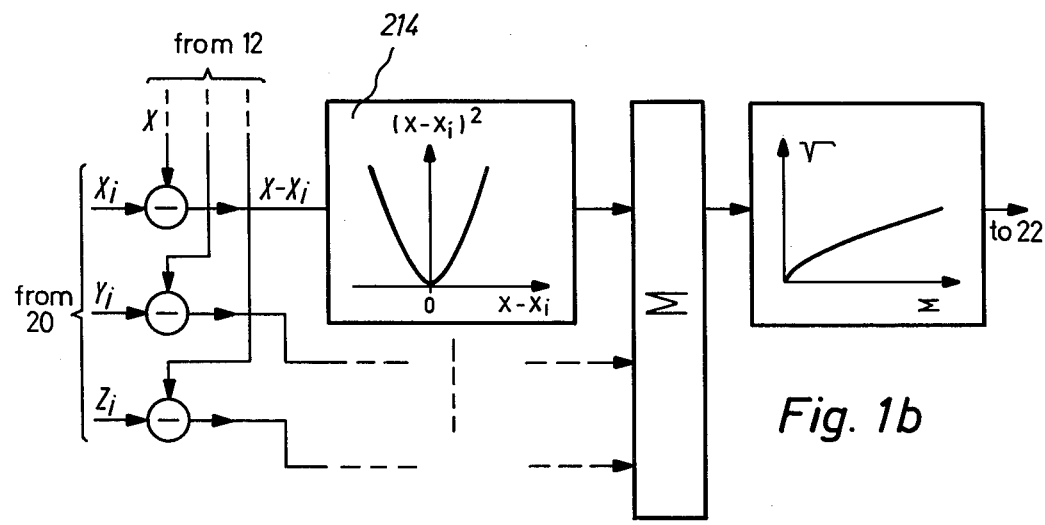
Fig. 1b
Fig. 1c
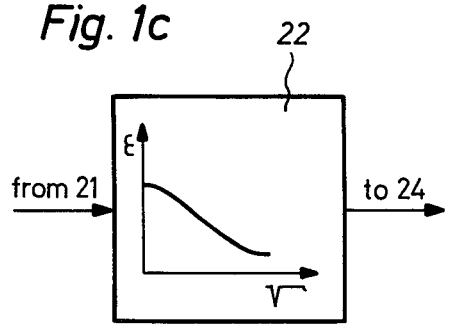
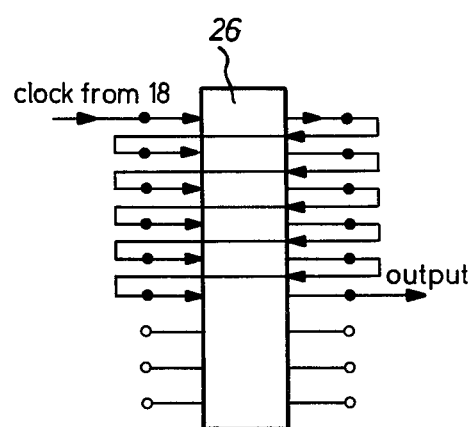
Fig. 1d

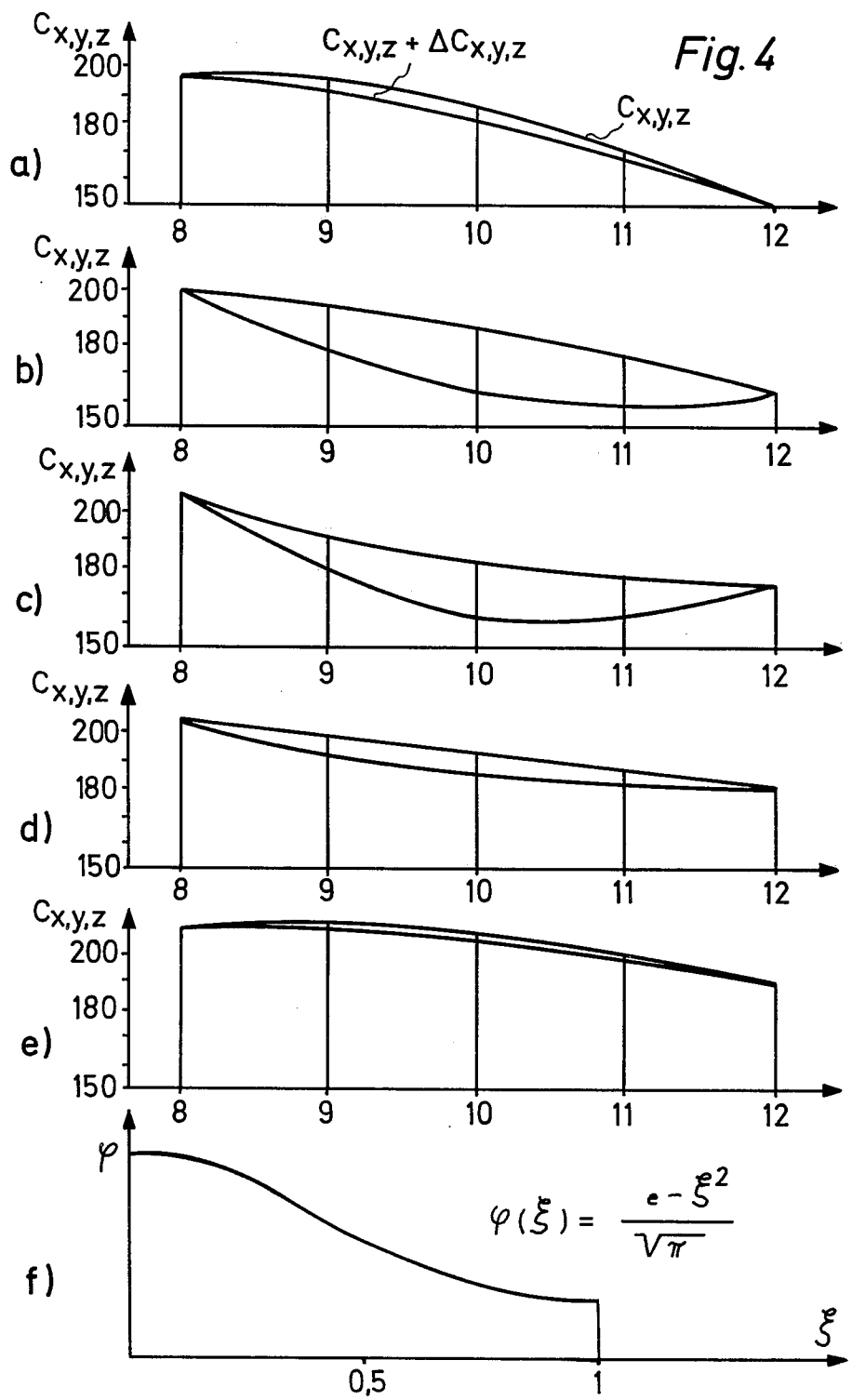

METHOD AND A DEVICE FOR RECORRECTING STANDARD COLOR CORRECTIONS IN A COLOR PICTURE RECORDING

BACKGROUND OF THE INVENTION

1. Field of the Invention

The present invention relates to a method and to a device for locally recorrecting standard color corrections in color picture recording by means of color reproduction devices, in which an addressable memory is provided for the color correction and emits a plurality of digitalized, trichromatic image scanning values and a corresponding plurality of corrected image recording signals as output values, whereby the assignment of memory input to memory output values is stepped into the memory before the reproduction is standardized color correction data.

2. Description of the Prior Art

A method for color correction is disclosed in U.S. Pat. No. 2,993,087 in which an opto-electronic scanning device scans an original, a memory for the color correction information is provided, and a recording unit records corrected color pictures or corrected color separations. After a trichromatic color separation, the scanning unit supplies primary color measuring value signals which are fed to the memory after digitalization, the memory containing the color correction parameters stored in the form of a schedule. If required, a transformation, i.e. matrixing of the color measuring value signals, can be carried out before or after the digitalization. In the case of a transformation, a corresponding output value combination of printing ink signals mg, cy, ye, bl are output for each input value combination of the digitalized color measuring values R, G, B or R', G', B', the printing ink signals containing a previously determined color correction which is aimed at in the standard case. This color correction represents a conversion of the assignment between the primary color measuring value signals R, G, B and the printing ink signals mg, cy, ye, bl. The printing ink signals obtained by means of the correction control the individual printing ink amounts during recording or, respectively, indicate a measure in that color separations for the appropriate printing density during printing. The basic principle of such a color correction unit can be basically stated by the following functional relationship:

Initial values (cy, mg, ye, bl)=F (scanning values R,G,B).

For devices of the type initially described above, the manufacturer makes available a library of standard assignments as so-called color correction sets with reproduction behavior optimized for specific pattern categories and printing conditions, the color correction sets being optionally input into the correction memory as so-called standard corrections. In comparison to previous, analog correction methods, this type of correction is more simple since the setting of color parameters is eliminated, but it has the disadvantage that it is not as flexible.

SUMMARY OF THE INVENTION

The object of the present invention is to provide an improved color reproduction of color pictures and a possibility with which local, targeted changes in the standard color corrections can be carried out even in this type of color correction.

According to the present invention, this object is achieved in that, for a location of the original to be specially corrected, the output signals of the color correction memory are measured and compared with predetermined values before reproduction, and in that, given deviation from the predetermined values, difference values for the correction between the determined values and the measured values are determined and stored.

More specifically, neighboring points lying within a predetermined spatial distance are determined proceeding from the coordinates of the location to be specially recorrected or, respectively, partial space of the color space, and correction values are calculated for the neighboring points. The correction valves of the standard correction data are then replaced by the correction values belonging to the neighboring points.

Also, the correction of the neighboring points continuously decreases up to a predetermined distance at which no further corrections are to ensue.

A device for carrying out the method described above, in which an opto-electric scanning device is provided for the original, an addressable color correction memory is provided which can be connected to the scanning device by way of an analog/digital converter is provided, an input unit is connected to the memory for the color correction data and a recording unit can be corrected to the memory, a display unit can be connected to the memory output for the display of the corrected printing ink signals of an image point of the original situated under the scanning unit, a printing signal memory is provided which be connected to the memory output for receiving the corrected printing ink signals of the image point situated under the scanning device, a rated value memory is provided having a printing ink signal rated value input, a comparator is connected to the printing ink signal memory and to the rated value memory for determining the differences between rated values and printing ink signals, and an adder is connectible to the color correction memory, the adder being connected by way of a difference value memory to the printing ink signal memory and the comparator.

Furthermore, an address memory can be connected to the color correction memory for receiving the address which belongs to the image point precisely situated under the scanning device. A distance calculator is connected to the address memory and to an address increase circuit, and the distance calculator determines the address distances of the memory locations within the color correction memory which neighbor the memory location of the image point precisely situated under the scanning device. A clock pulse generator is connected to the address increase circuit by way of a counter and a correction evaluation device is connected to the distance calculator and the adder, the correction evaluation device comprising an evaluation circuit containing a distance function and an input device. A linkage circuit is connected between the evaluation circuit and the difference value memory, whereby, controlled by means of the clock pulse generator, the correction values deposited under the neighboring addresses in the color correction memory are replaced, proceeding from the newly-determined correction value, in the sense of a distance-wise decrease of the additional correction.

By means of the above features, the range of application of the correction is increased and an optimization is also achieved, since this additional fine correction allows an adaptation to colors of the original which determine the picture. So-called editorial changes are rendered possible with which the correction can be subsequently altered in such a manner that, for example, skin colors, furniture colors, or other color values, can be reproduced in the color separations (color separation films) and, therefore, in printing in the manner described and deviating from the color of the original.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a basic block diagram of a correction unit constructed in accordance with the present invention;

FIGS. 1a–1d are block diagram examples of individual circuit components which may be used in practicing the present invention;

FIGS. 4a–4f are graphic illustrations of the few examples for the evaluation functions of the correction.

DESCRIPTION OF THE PREFERRED EMBODIMENTS

Figure 2:
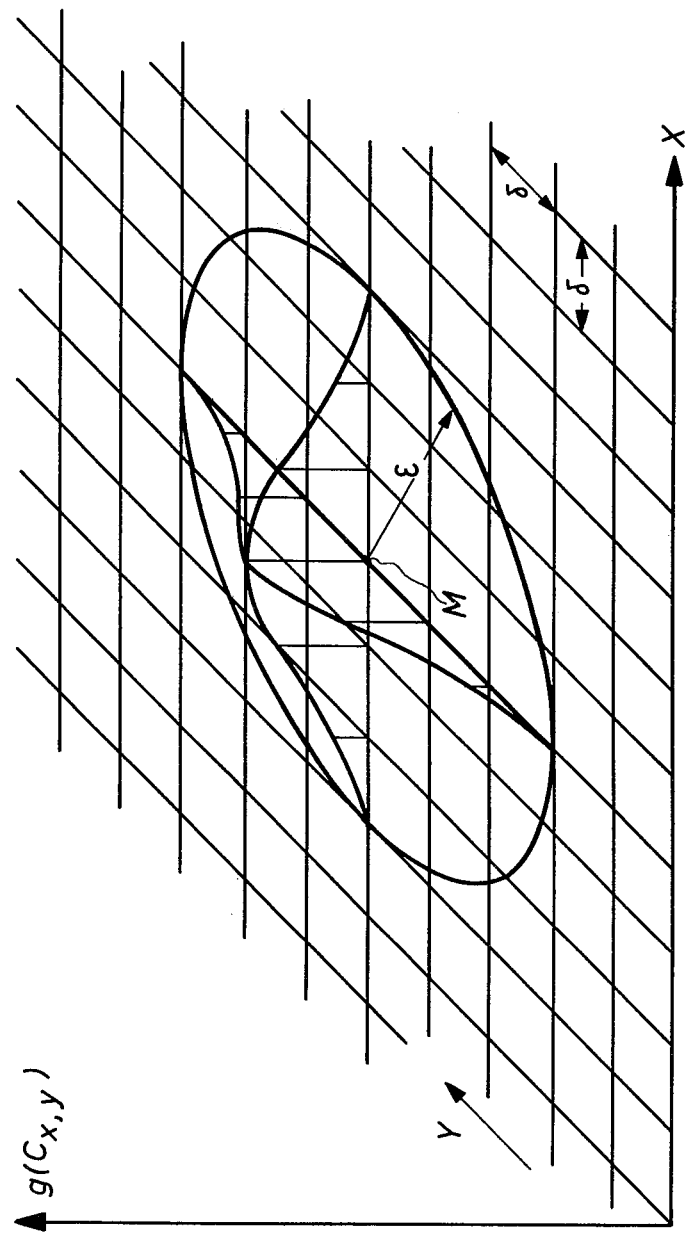
FIG. 2 is a cross section taken through the color space in order to illustrate the course of a local correction.

Referring to FIG. 1, a correction unit constructed in accordance with the present invention is illustrated as comprising a scanning unit 1 which is well known in the art and available on the market for quite some time in the printing technology for scanning originals. Therefore, structure can be employed for the scanning unit 1 as disclosed in FIG. 1 of U.S. Pat. Nos. 3,983,319 or 3,798,707, or a scanning unit can be employed which works with a color television camera as, for example, the Chromaskop which is fully disclosed in the publication "Chromaskop, Electronic Color Display and Correction Unit," March 1978, Dr.-Ing. Rudolf Hell GmbH, D-2300 Kiel 14, Germany, p. 4, functional diagram, component 8, camera amplifier. What these various scanning units share is that the color original is scanned trichromatically and that the signals are subjected to a pre-amplification and subsequent logarithmization or other distortions, by means of the signal treatment stage 2. The signal processing in the signal treatment stage 2 is meant to include an analog/digital conversion of the trichromatic R, G, B scanning signals. The signal processing is not illustrated in detail in that the same represents technology which is well known to those skilled in the art. The analog/digital conversion of the R, G, B signals simply occurs in that, after separation, the signals supplied from the scanning unit are respectively supplied to multi-stage analog/digital converters as are marketed, for example, by the Ampex Company. The insertions of these analog/digital converters in the signal path is represented, for example, in U.S. Pat. No. 3,272,918, in FIG. 1.

As already mentioned, the digitalized scanning signals should occur at the output of the signal treatment stage 2 and are supplied via a multiple switch $S_1$ to an input register 3 of a color correction memory 4 which converts the R, G, B input values into corrected printing ink signal values mg, cy, ye, bl during reproduction. The color correction memory is a simple digital memory which contains the corresponding assignments of R, G, B input values to the printing ink output values in the form of a schedule. These values for the assignment of input and output values are obtained in a separate process, for example, according to British Pat. No. 1,541,554 and represent the so-called standard color correction data which are stored, for example, on a disc memory 5 which is connected to the correction memory 4. Therefore, the digitally coded color correction data are fed into the memory 4 for the reproduction from the disc memory 5, whereby an address counter 6 is counted up and the data are inscribed in the memory 4. For example, the module type SN74161 of the Texas Instruments Company can be employed as the address counter and the memory type 3943 of Siemens AG, Germany, can be employed as the disc memory 5.

If one is to work with a standard correction, the memory 4 converts the input signals R, G, B into the corrected output values via addresses X, Y, Z during operation. The corrected output signals then proceed via an output register 7 to a recording unit for color separations (not shown) which records the color separations simultaneously or individually in succession. Devices for the simultaneous recording of a plurality of color separations are known, for example, from U.S. Pat. No. 2,721,892 and from the German published application No. 2,321,689. An individual recording can be carried out, for example, on a single drum via selector switches by means of a single recording element. Such recording units have been known for a long period of time and work with or without screening in the production of color separations. An unscreened recording is described, for example, in U.S. Pat. No. 3,272,918 and a screened recording is disclosed in U.S. Pat. No. 3,725,574. A screen recording unit is further contained in the device known as the Chromagraph DC 300 of Dr.-Ing. Rudolf Hell GmbH, D-2300 Kiel, 14, Germany, and is described in the publication "Chromagraph DC 300 Scanner for Top Quality Color with Our Reproduction," March 1979, Dr.-Ing. Rudolf Hell GmbH, D-2300 Kiel 14, Germany, p. 4. Since this recording is not the subject matter of the present invention, it will not be described in greater detail below. A further possibility is the intermediate storage of the color separations for later reproduction, i.e. of supplying the output signals of the color correction memory 4 to another memory, for example, a disc memory 4'.

In order to be able to carry out a partial correction of the previously input standard correction, the operator approaches a location of the original with the optics of the original scanning device before the actual reproduction, which location is that which is to be subjected to the desired partial correction. Such scanning devices also have been known for quite some time and advantageously exhibit a microscope with a crosshair in the optics head of the scanning unit, through which crosshair the desired location of the original can be sighted. A device which has been on the market for a long time and contains such a scanning head is the aforementioned Chromagraph DC 300, the viewing technique being described on Page 5, upper figure, of the above-mentioned chromagraph DC 100 publication. Instead of such a scanner, stored picture data can also be called up, displayed on a monitoring screen and the desired location of the original can be approached with a cursor.

When the switch $S_1$ is closed, then the R, G, B scanning data which have passed through the signal treatment stage 2 are available at the memory input after analog/digital conversion as X, Y, Z addresses. The corrected color separation signals of the standard color correction which belong to the image point approached and which belong to the input addresses are then available in the output register 7 of the memory 4. The data are made visible with a plurality of instruments 8, 9, 10 and 11 which are calibrated in respective printing densities or screen point percentages. The operator sees whether the values correspond to the desired density value or not. If a deviation exists, he presses a key which actuates the switches $S_2$ and $S_3$ and causes storage of the input addresses X, Y, Z as well as the output values mg,cy,ye and bl. For this purpose, a memory 12 is provided for the input addresses and a memory 13 is provided for the output values. The memory type 74374 of the Texas Instruments Company can be employed for each of the memories 12 and 13. Subsequently, the rated values mg, cy, ye, bl are input via a keyboard 14 into a rated value memory 15 for which the same module of the Texas Instruments Company can be employed as for the memories 12 and 13. With the assistance of a comparator 16, the difference between the rated or reference values with respect to the output values stored in the memory 13 is determined and input into a further memory 17. A Texas Instruments Company module SN7485 may be employed for the comparator 16 and the Texas Instruments Company module SN74374 can also be employed for the memory 17. Since the correction is preferably not only to be effected for an individual point, but also in a predetermined color space area, the correction data of the points surrounding the point approached by the operator, said point being that whose correction data are to be changed in the memory, are likewise changed, i.e. recorrected. By so doing, the neighboring points should preferably not obtain the same correction strength, but, rather, the correction should decrease in a predetermined range of influence about the point determined by the operator which is to obtain the full correction (Gaussian Function Linear Decrease or similar characteristics are conceivable). In case one is working with cylindrical coordinates, the range of influence can also be an asymmetrical sub-color space.

To this end, a distance calculation of the neighboring color space points to the point approached by the operator is carried out in a separate operation, whereby all points of the color space which lie beyond a predetermined distance $\epsilon$, which specifies the range of influence of the correction, are not taken into consideration. A clock pulse generator 18 which operates an address counter 19 is provided for obtaining the neighboring points. Such clock pulse generators are universally known and employed as components in digital techniques and, for example, a Texas Instruments Company module SN74161 may be employed for the address counter 19. The precise construction of the address counter 19 is illustrated in greater detail in FIG. 1a in which three counters 191, 192 and 193 are provided for the X, Y and Z address of the aforementioned type and are connected with their carry lines to the input of the next counter. One counter, for example, the X-counter 191 is charged at its input by the clock pulse which arrives from the clock pulse generator 18. If the counter runs over, the next counter 192 for the Y address is driven, etc. The counting values X, Y and Z arising with each clock pulse signal then occur at the output lines of the counters. As already mentioned, the X, Y and Z addresses are stored in the memory 12 and likewise occur at an address increase circuit 20 which is connected to the memory 12. The address increase circuit 20 can consist of simple adders, for example, the four-bit full adders, type SN74283 of the Texas Instruments Company.

At each clock pulse, the addresses of the stored, approached image points X, Y, Z are increased in the address increase circuit 20 by "1" and the respective distances of the neighboring points $X_i$, $Y_i$, $Z_i$ to the point approached are calculated in a distance calculator 21, whereby the beginning of the count should start at the point $(X-\epsilon)$, since only one-fourth of a sphere would otherwise be covered. The distance calculator 21 may calculate the distance according with the equation $$\epsilon = \sqrt{(X - X_i)^2 + (Y - Y_i)^2 + (Z - Z_i)^2}.$$

The distance calculator 21 is illustrated in greater detail in FIG. 1b in which the X, Y and Z values arriving from the memory 12 are supplied to respective subtractors and the values $X_i$, $Y_i$ and $Z_i$ are provided to the respective subtractors from the address increase circuit 20. As is general in digital technology, the subtraction is not carried out as a subtraction, but, rather, as a negative addition, to which end simple adders of the type SN74283 of the Texas Instruments Company can be employed. The result of each subtraction is fed to a tabular memory 214 for the X, Y and Z values, which tabular memory 214 contains a table which emits the values $(X-X_i)^2$ for the $(X-X_i)$ input values. For the sake of simplicity, only one such memory 214 is illustrated in which the curve of the corresponding parabola function is schematically illustrated. The memories for the Y and Z values are executed identically. The output values of the tabular memories 214 for the Y and Z values are connected, along with the X value, to a summer 215 to which, in turn, a tabular memory 216 is connected which converts its input values into corresponding root values. The result, namely the respective distance of the neighboring points to the X, Y and Z values of the point that is presently under the scanner occurs at its output. The result is supplied to an evaluation stage 22 which, again, comprises a tabular memory which contains a function according to the evaluation, i.e. the course of the correction, around which the point approached is to occur. At the same time, the maximum distance $\epsilon$ is fed into the evaluation stage 22, that is the distance beyond which a correction is to no longer occur. This stage is illustrated in greater detail in FIG. 1c. As already mentioned, it also comprises a tabular memory 221 which, for example, contains the function illustrated in FIG. 4f as the response to its input signal. This function, also, will later be described in greater detail in connection with the description of FIG. 4f.

The result of the distance calculation is fed to a multiplication stage 24 which, for example, may be constructed with the Texas Instruments module SN74274. The multiplication stage 24 is connected to the memory 17 and multiplies the difference from the correction rated value with the result of the distance evaluation. In this manner, one obtains the so-called actual-delta correction values for the neighboring points and adds these in the summer 25 (type SN74283 of the Texas Instruments Company) to the actual values which are stored in the memory 13. The result is the values which correspond to the desired correction. The corresponding values of the standard correction in the memory are overwritten with these corrected values. The entire operation is individually carried out for each neighboring point which falls in the distance area, namely by means of forward counting of the address counting device 19 or, respectively, of the address increase stage. In order to carry out a point-wise processing of the data, the clock pulse generator 18, as already mentioned, is provided and is started after the transfer of the input values X, Y, Z and of the output values mg, cy, ye, bl into the memories 12 and 13, the input of the rated values by means of the keyboard 14 and the input of the range of influence $\epsilon$. The time between two clock pulses is dimensioned in such a manner that the distance calculation in the distance calculator 21, the calculation of the $\Delta$ values from the rated values in the comparator 16, as well as the multiplication of the distance values evaluated in the evaluation stage 22 with the $\Delta$ values in the multiplication stage 24 and the summing and the inscription of the correction values has terminated. Obtaining such clock pulses from a basic clock pulse is relatively simple and is illustrated in FIG. 1d. An input clock pulse, for example, is supplied to an input of a register. The output of the register belonging to this input is connected to the next register input and its output is in turn connected to the next register input, etc. Depending upon how many stages one bridges in this manner, one may obtain clock pulses appropriately delayed with respect to the basic clock pulse, as is to occur in the pulse generator 26.

A switch $S_5$ which is only closed for the calculation of the $\Delta$ values, but is otherwise open, is provided between the memory 13 and the comparator 16. A further switch $S_6$ which is closed for the duration of the inscription of the correction values, being closed with the clock pulse obtained by means of delay in the pulse generator 26, is provided between the summer 25 and the correction memory 4. The summer 25 may be constructed from the Texas Instruments module type SN74283. After the stepping-in of a correction value has occurred, the next clock pulse of the generator 19, proceeding from the preceding address, will increase the address by "1" via the address counter of the address increase circuit 20. The next point of the color space is selected via the line 201 extending between the address increase circuit 20 and the input register 3 of the color correction memory 4, and the appertaining output values of the standard correction reside in the output register 7. At the same time, the address is also increased by "1" in the distance calculator 21 and the distance calculation for the new neighboring point can be carried out. The following operations then proceed as in the previous image point, until all points within the range of influence have been taken care of. The consideration of the correction curve for the range of influence can occur in various ways. The function according to which the evaluation in the evaluation stage 22 is undertaken, for example, can be selected in such a manner that no values are output for all values which are greater than $\epsilon$, as is illustrated in FIG. 1c and in FIG. 4f. In another case, the calculated distance can be compared with the value $\epsilon$ and the corresponding function value can be derived from the function value which, for example, exists as a table. The latter possibility has the advantage that a function input can be employed for a series of $\epsilon$ values.

A further possibility is the elimination of the distance calculation in which the course of the function $$\epsilon = \sqrt{(X - X_i)^2 + (Y - Y_i)^2 + (Z - Z_i)^2}$$

is also taken into consideration in the evaluation function. This simplifies the circuit, since the evaluation stage 22 can be eliminated, because the tabular memory 216 of the distance calculator 21 can readily contain this function.

For a better understanding of the invention, reference is made to FIG. 2 which illustrates how the partial correction of the point approached by the operator is to occur within the color space. Corresponding addresses X, Y, Z within the correction memory are assigned to the R, G, B values of this point, whereby it has been assumed, for the sake of simplification, that the addresses X, Y, Z are subdivided in equal steps, i.e. that the R, G, B values are quantized in equal steps. The intersections of the network constructed through the X, Y plane at the distance $\epsilon$ respectively produce the addresses of the neighboring points with respect to the central point within the X, Y plane. This plane represents a section through the color space for a constant Z. The circle within the radius $\epsilon$ is inscribed in FIG. 2 around a point M, within which circle the correction is to be effective. An evaluation function is indicated over the X, Y plane, by means of which the distance values for the correction are to be weighted in the evaluation stage 22. At the central point M, the correction is to amount to 100% and is equal to zero in the case illustrated here at the distance from the point M and defined by the periphery of the circle having the radius FIG. 2 represents only one section in a plane; in reality, the range of influence in which the neighboring points lie is a spherical volume within the radius $\epsilon$ and the evaluation function likewise becomes effective in the other coordinate directions.

A further possibility in the distance evaluation is that this function can be variously selected for various separations, mg, ye, cy, bl.

Figure 3:
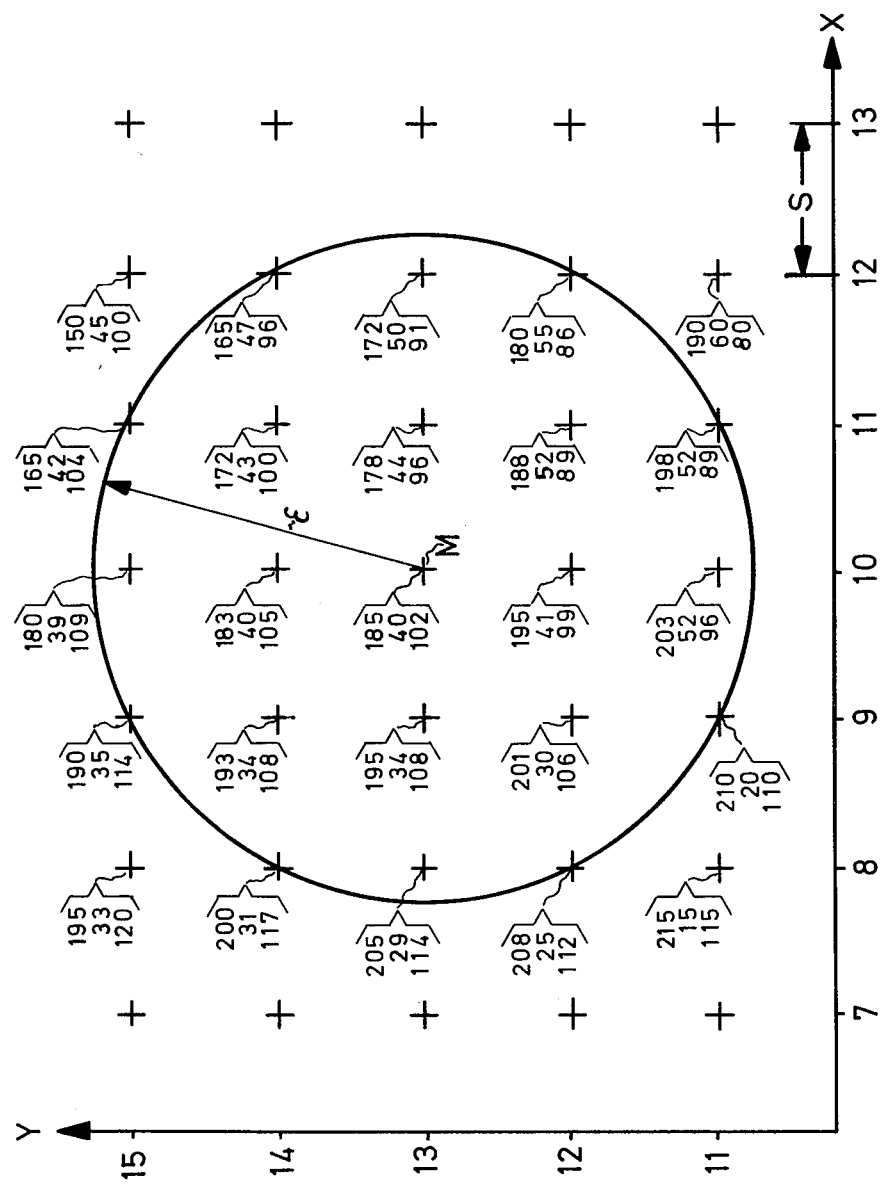
FIG. 3 is a graphic illustration with numerical values for the correction course in a cross section through the color space.

FIG. 3 illustrates an example of a few values in the X, Y plane for the individual points of the color correction within the range of influence $\epsilon$. The distance from one neighboring point to the next again amounts to $\delta$. Let the R, G, B values be subdivided, for example, into 256 steps and the central point M be located at X=10, Y=13 and has the values ye=185, mg=40 and cy=102.

FIGS. 4a-4e illustrate a number of examples for the evaluation function as the same can be applied to the numerical example of FIG. 3. In sections for 5 coordinate values Y=11 through Y=15 according to FIG. 3, FIGS. 4a-4e illustrate how the correction components are distributed to the standard correction values in the color space within the correction with $\epsilon$, here on the basis of the yellow separation. The previous values of the standard correction program are thereby illustrated as perpendicular beams having a suppressed zero point. The appertaining correction value is added thereto. If one connects the end points of the straight lines in the added segment and the end points of the original correction values, then one obtains a surface which represents the course of the correction within the individual sections.

FIG. 4f illustrates an example of a characteristic curve having a Gaussian distribution according to which the correction can be carried out. A correction strength of 100% is prescribed for the central point. The further correction curve can be reproduced by means of the equation $$\phi(\xi) = \frac{e^{-\xi^2}}{\sqrt{\pi}}.$$

The distance is specified in $\epsilon$ units and therefore proceeds from 0 through 1. After the value $\epsilon = 1$, the correction is no longer to be effective and the values of the standard correction are to be taken over. Let it also be pointed out that the invention is not limited to the exemplary embodiment specifically discussed herein and illustrated on the drawings. For example, it is also possible to input the calculated correction data into a separate memory and to call up such data from the separate memory during reproduction in case the same are required.

Other changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a method for the area-wise change of standardized color corrections in color reproduction devices in which an addressable memory receives a plurality of digitalized trichromatic picture scanning values as input values and emits a corresponding plurality of corrected picture recording signals as output values, and in which an assignment of memory input to memory output values is input into the memory as standardized color correction data before the reproduction, the improvement therein comprising the steps of:
   for a location to be specially corrected, measuring the color correction values;
   forming difference values from the deviations between the memory output signals and predetermined values;
   calculating correction values from the difference values; and
   replacing the corresponding correction values in the addressable memory with the calculated correction values.

2. The improved method of claim 1, for the correction of neighboring points within a predetermined distance from the coordinates of the location, comprising the further steps of:
   calculating correction values for the neighboring points; and
   replacing the correction values of the standard correction data with the calculated correction values.

3. The improved method of claim 2, wherein the step of calculating is further defined as:
   continuously decreasing the correction values for the neighboring points outwardly from the location up to a predetermined distance at which no further corrections are to occur.

4. The improved method of claim 3, comprising the further step of:
   storing the calculated correction values in a separate memory.

5. The improved method of claim 4, wherein the step of continuously decreasing is further defined as:
   continuously decreasing the difference values within a partial color space in accordance with a predetermined function.

6. The improved method of claim 5, wherein said predetermined function is a Gaussian function.

7. The improved method of claim 5, comprising the further step of:
   converting the correction data into recorrection data before storage in the addressable memory.

8. The improved method of claim 5, wherein the step of continuously decreasing is further defined as:
   continuously decreasing the difference values within a partial color space in accordance with a predetermined function using cylindrical coordinates.

9. In apparatus for the area-wise change of standardized color corrections in color reproduction devices in which an addressable memory receives a plurality of digitalized trichromatic picture scanning values as input values and emits a corresponding plurality of corrected picture recording signals as output values, and in which an assignment of memory input to output values is input into the memory as standardized color correction data before the reproduction, the improvement therein comprising:
   for a location to be specially corrected, means for measuring the color correction values;
   means for forming difference values from the deviations between the memory output signals and predetermined values;
   means for calculating correction values from the difference values; and
   means for replacing the corresponding correction values in the addressable memory with the calculated correction values.

10. The apparatus of claim 9, for the correction of neighboring points, within a predetermined distance from the coordinates of the location, further comprising:
    means calculating correction values for the neighboring points; and
    means for replacing the correction values of the standard correction data with the calculated correction values.

11. The apparatus of claim 10, wherein said means for calculating is further defined as:
    means for continuously decreasing the difference values for the neighboring points outwardly from the location up to a predetermined distance at which no further corrections are to occur.

12. The apparatus of claim 11, further comprising:
    means for storing the calculated difference values in a separate memory.

13. The apparatus of claim 12, wherein said means for continuously decreasing is further defined as:
    means for continuously decreasing the difference values within a partial color space in accordance with a predetermined function.

14. The apparatus of claim 13, wherein said predetermined function is a Gaussian function.

15. The apparatus of claim 13, comprising: means for converting the correction data into recorrection data before storage in the addressable memory.

16. The apparatus of claim 13, comprising
    means for continuously decreasing the difference values within a partial color space in accordance with a predetermined function using cylindrical coordinates.

17. In an apparatus for providing area-wise changes of standardized color corrections in color reproduction devices, in which an addressable memory is provided for the color correction, which memory receives a plurality of digitalized trichromatic picture scanning values as input values and emits a corresponding plurality of correct picture recording signals as output values, whereby the assignment of memory input and memory output values is input into the memory as standardized color correction data before the reproduction, and including a recording unit which can be connected to the correction memory, the improvement comprising:

- a display unit connectible to the output of the color correction memory for displaying the corrected printing ink signals of an image point of the original situated under the scanning unit;
- a printing ink signal memory connectible to the output of said color correction memory for receiving the corrected printing ink signals of the image point situated under the scanning device;
- a reference value memory having a printing ink signal reference value input for receiving reference values;
- a comparator connected to said printing ink signal memory and to said reference value memory for determining the differences between reference values and printing ink signals;
- a difference signal memory connected to said comparator for receiving difference signals; and
- an adder connectible to said color correction memory, said adder being connected by way of said difference signal memory to said printing ink signal memory and said comparator.

18. The improved apparatus of claim 17, comprising:
- an address memory connectible to said color correction memory for receiving the address which is assigned to said image point precisely situated under said scanning device;
- a distance calculator connected to said address memory for determining the address distances of the memory locations within the color correction memory of points which neighbor the memory location of the image point precisely situated under said scanning device;
- an address increase circuit connected between said address memory and said distance calculator; an address counter connected to operate said address increase circuit;
- a clock pulse generator connected to operate said address counter;
- a correction evaluation circuit connected to said distance calculator and to said adder, said correction evaluation circuit comprising an evaluation circuit containing a distance function for receiving an input; and
- a linkage circuit connected to said evaluation circuit and to said difference memory, whereby said linkage circuit is controlled via said clock pulse generator such that the correction values stored under the neighboring addresses in the color correction memory are replaced, proceeding from the newly-determined correction values, in the sense of a distance-wise decrease of the additional correction.

* * * * *